United States Patent
Jöngren et al.

(10) Patent No.: US 8,726,131 B2
(45) Date of Patent: May 13, 2014

(54) SPATIAL MULTIPLEXING COMMUNICATION SYSTEM WITH ENHANCED CODEWORD MAPPING WITH FLEXIBLE RATE SELECTION ON EACH SPATIAL LAYER AND WITH SINGLE HARQ PROCESS

(75) Inventors: George Jöngren, Stockholm (SE); Stefano Sorrentino, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 444 days.

(21) Appl. No.: 13/063,958

(22) PCT Filed: Sep. 18, 2009

(86) PCT No.: PCT/IB2009/006892
§ 371 (c)(1),
(2), (4) Date: Mar. 15, 2011

(87) PCT Pub. No.: WO2010/032122
PCT Pub. Date: Mar. 25, 2010

(65) Prior Publication Data
US 2011/0185249 A1 Jul. 28, 2011

Related U.S. Application Data

(60) Provisional application No. 61/098,086, filed on Sep. 18, 2008.

(51) Int. Cl.
*H03M 13/00* (2006.01)
*H04L 1/18* (2006.01)
*H04L 1/00* (2006.01)
*H03M 13/35* (2006.01)
*H04L 5/00* (2006.01)

(52) U.S. Cl.
CPC ............ *H04L 1/0086* (2013.01); *H03M 13/00* (2013.01); *H04L 1/0003* (2013.01); *H04L 1/0009* (2013.01); *H04L 1/1812* (2013.01); *H04L 1/007* (2013.01); *H03M 13/35* (2013.01); *H04L 5/003* (2013.01)
USPC .......................................... 714/774; 714/751

(58) Field of Classification Search
CPC ... H04L 1/0086; H04L 1/0003; H04L 1/0009; H04L 1/1812; H04L 1/007; H04L 5/003; H03M 13/356; H03M 13/35
USPC ................................................ 714/751, 774
See application file for complete search history.

(56) References Cited

U.S. PATENT DOCUMENTS 6,604,216 B1 * 8/2003 Javerbring et al. .......... 714/751
6,677,864 B2 * 1/2004 Khayrallah .................... 341/50

(Continued)

FOREIGN PATENT DOCUMENTS

EP     1 865 642 A1    12/2007
EP     1895700 A2     3/2008

(Continued)

OTHER PUBLICATIONS

Office Action dated Apr. 18, 2013. Application No. 09 786 262.7-1860.

(Continued)

*Primary Examiner* — Joseph D Torres

(57) ABSTRACT

A method of data transmission includes encoding an information block according to a predetermined retransmission protocol to generate, for a single hybrid automatic repeat request (HARQ) instance, a transport block having information bits and error detection bits and channel coding different parts of the transport block using different modulation and coding schemes to generate one or more codewords for transmission to a receiving station.

16 Claims, 6 Drawing Sheets

(56) References Cited

U.S. PATENT DOCUMENTS

| | | | |
|---|---|---|---|
| 7,206,332 B2 * | 4/2007 | Kwan et al. | 375/140 |
| 7,392,460 B2 * | 6/2008 | Kim et al. | 714/781 |
| 7,450,611 B2 * | 11/2008 | Kim et al. | 370/471 |
| 7,508,804 B2 * | 3/2009 | Das et al. | 370/342 |
| 2004/0268206 A1 * | 12/2004 | Kim et al. | 714/758 |
| 2005/0063378 A1 * | 3/2005 | Kadous | 370/389 |

FOREIGN PATENT DOCUMENTS

| | | |
|---|---|---|
| WO | WO 2008/023930 A2 | 2/2008 |
| WO | WO 2008/030806 A2 | 3/2008 |

OTHER PUBLICATIONS

QUALCOMM Europe: "Analysis of Support Channel Overhead for DL MIMO". 3GPP TSG-RAN WG1 #47. R1-063439. Nov. 6-10, 2006. Riga, Latvia.

Ericsson, et al: "Adaptive Modulation and Channel Coding Rate Control for Frequency Domain Scheduling in Evolved UTRA Downlink". 3GPP TSG RAN WG1 #42bis. R1-051149 (Original R1-050854). Oct. 10-14, 2005. San Diego, USA.

Samsung: "Adaptive modulation and channel coding rate". 3GPP TSG-RAN WG1 LTE Ad Hoc Meeting. Tdoc R1-060076. Jan. 23-25, 2006. Helsinki, Finland.

Japanese Office Action dated Sep. 25, 2013.

* cited by examiner

SPATIAL MULTIPLEXING COMMUNICATION SYSTEM WITH ENHANCED CODEWORD MAPPING WITH FLEXIBLE RATE SELECTION ON EACH SPATIAL LAYER AND WITH SINGLE HARQ PROCESS

RELATED APPLICATION

This application claims the benefit of U.S. Provisional Application No. 61/098086, filed Sep. 18, 2008, the disclosure of which is fully incorporated herein by reference.

FIELD OF THE INVENTION

The invention relates generally to methods and apparatus for transmitting signals using multiple transmit antennas and, more particularly, to methods and apparatus for spatially precoding multiplexing transmitted from a multiple antenna transmitter.

BACKGROUND

Modern wireless communication systems for packet based communication often use a retransmission protocol such as hybrid automatic repeat request (HARQ) on the physical layer to achieve greater reliability and robustness against the impairments of the radio channel. Long Term Evolution (LTE) and Wideband Code Division Multiple Access (WCDMA) are two examples of communication systems using HARQ. HARQ combines forward error correction (FEC) with ARQ by encoding an information containing data block, also known as transport block (TPB), in a FEC encoder and then adding cyclic redundancy check (CRC) bits or other error detection bits to the coded bits output from the FEC encoder. The coded data block is referred to as a codeword in the LTE and WCDMA systems. After reception, the data block is decoded and the CRC bits are used to check whether the decoding was successful. If the data block is received without error, an acknowledgement (ACK) is sent to the transmitter indicating successful transmission of the data block and a new data block is transmitted. On the other hand, if the data block was not decoded correctly, a negative ACK (NACK) is sent by the receiver to request a retransmission. Depending on the implementation, the transmitter may resend the same data block, or may send different data (incremental redundancy). The receiver may decode the retransmission independently or combine the retransmission with data received in the prior transmission.

Multiple antenna systems are also receiving significant attention for packet data communication systems as one way to increase data transmission rates. Multiple input, multiple output (MIMO) systems employ multiple antennas at the transmitter and receiver to transmit and receive information. The receiver can exploit the spatial dimensions of the signal at the receiver to achieve higher spectral efficiency and higher data rates without increasing bandwidth.

One transmission scheme that is often used for MIMO systems is spatial multiplexing. In a spatial multiplexing transmitter, the information symbols in the codewords output from the HARQ process are mapped to one or more spatial layers. Multiple codewords from multiple HARQ processes can be transmitted simultaneously. When multi-codeword transmission is used, the HARQ can be carried out independently on different layers. The LTE standard specifies a number of fixed codeword to layer mappings.

Some spatial multiplexing schemes support Long Delay Cyclic Delay Decoding (LDCDD) as a means of averaging the received quality (i.e., the Signal to Interference and Noise Ratio (SINR)) over all the layers. LDCDD is particularly useful in situations where the Channel Quality Information (CQI) of each layer cannot be estimated in a reliable way, e.g., in the presence of non-stationary interference or moderate to high mobility. By averaging the quality of the layers, the probability of a dip in the quality of a received codeword is reduced and the robustness of the link is increased. Averaging the quality of the layers also means the channel quality for each layer become more or less similar to the channel qualities of all the other layers Assuming that the codeword from each HARQ process is individually mapped to a different layer or different groups of layers, an attractive decoder for multi-codewords transmission is Successive Interference Cancellation (SIC) decoder. SIC is an iterative decoding technique that estimates one codeword during each iteration. The key idea of SIC is to recursively remove from the received signal the contribution of the layers that have already been decoded. Under the realistic assumption that the previous codewords have been correctly decoded, inter-layer interference is reduced on each subsequent iteration of the decoder By doing so, the channel quality, or effective SINR, associated to each codeword increases after the interference of the previously decoded layers is removed.

If one assumes that LDCDD is employed at the transmitter, all the received codewords experience approximately the same effective SINR, which is denoted $SINR_0$, due to the effect of the layer mixing introduced by LDCDD before the first iteration of the SIC decoder. During the first iteration of the SIC decoder, the first codeword is decoded and its contribution is subtracted from the received signal. Therefore, all the remaining codewords now experience $SINR_1 > SINR_0$ due to the removal of cross layer interference from the first layer. This process is repeated for all the codewords, resulting in an increasing SINR for each codeword after interference from each previously decoded layer is removed. The effective SINR for each layer or codeword may be denoted $SINR_0 < SINR_1 < \ldots < SINR_r$, where r is the number of layers.

The maximum rate of information R that can be reliably transmitted on the ith layer is a direct function of the effective SINR for the corresponding codeword, i.e., $R_i = f(SINR_i)$. Therefore, it is clear that an efficient system employing SIC and LDCDD should assign the transmit rates associated to each codeword as $R_0 < R_1 < \ldots < R_r$.

The current assumption in the technical literature is that single codeword transmission is not suitable for SIC because the same modulation and coding scheme (MCS) would be used for each layer. Therefore, conventional wisdom in the technical literature dictates that multi-codeword transmission with a separate HARQ process for each codeword should be used when it is desired to implement SIC. The implementation of separate HARQ process may require significant upgrades to base stations that support only single rank transmissions. Further, using a separate HARQ process for each codeword increase the MAC resources and signaling overhead for multi-codeword transmission. If the data transmission rates for each codeword are correctly assigned, both the codewords have the same high probability of being decoded correctly and consequently an ACK message will be sent for both codewords. On the other hand, if the receive SINR at the first iteration has been overestimated, both codewords are likely to be incorrectly decoded and a NACK will be reported by both the HARQ processes. Thus, the increase in MAC resources and signaling overhead to implement separate HARQ processes does not in such cases appear to improve system performance.

SUMMARY

The present invention relates to a transmission scheme for spatial multiplexing MIMO systems that allows use of SIC at the receiver with a single HARQ process or multiple HARQ processes. Error detection bits are added to an information block to generate and transport block (TPB) for a single HARQ instance having information bits and error detection bits. The transport block is then divided into two or more parts referred to herein as sub-blocks. Each sub-block is encoded according to a different modulation and coding scheme (MCS). The sub-blocks are combined to form two or more codewords for transmission to a receiving station. In some embodiments, the codewords are transmitted by a spatial multiplexing transmitter. When spatial multiplexing is used, each codeword is mapped to one or more transmissions layers and transmitted from multiple antennas.

DETAILED DESCRIPTION

Figure 1:
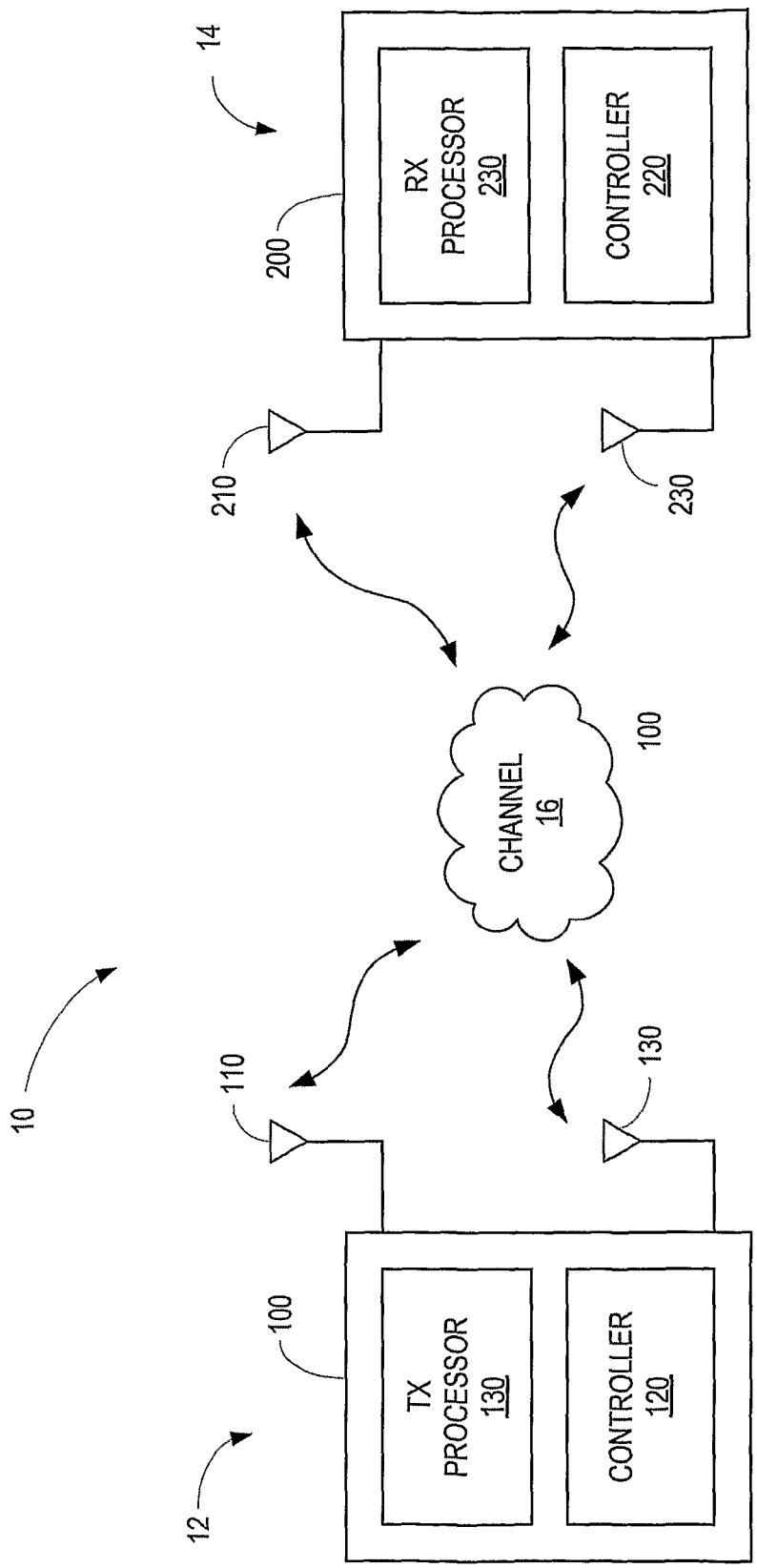
FIG. 1 illustrates an exemplary multiple-input, multiple-output communication system.

FIG. 1 illustrates a multiple input/multiple output (MIMO) wireless communication system 10 including a first station 12 and a second station 14. The first station 12 includes a transmitter 100 with multiple transmit antennas 110 for transmitting signals to the second station 14 over a communication channel 16, while the second station 14 includes a receiver 200 with multiple receive antennas 210 for receiving signals transmitted by the first station 12. Those skilled in the art will appreciate that the first station 12 and second station 14 may each include both a transmitter 100 and receiver 200 for bi-directional communications. In one exemplary embodiment, the first station 12 comprises a base station in a wireless communication network, and the second station 14 comprises a user terminal. The present invention may be used, for example, in Orthogonal Frequency Division Multiplexing (OFDM) systems. Those skilled in the art will appreciate, however, that the invention is also useful in systems that use other multiple access schemes.

An information signal in the form of a binary data stream is input to the transmitter 100 at the first station 12. The transmitter 100 includes a controller 120 to control the overall operation of the transmitter 100 and a transmit signal processor 130. The transmit signal processor 130 performs error coding, maps the input bits to complex modulation symbols, and generates transmit signals for each transmit antenna 110. After upward frequency conversion, filtering, and amplification, transmitter 100 transmits the transmit signals from respective transmit antennas 110 through the communication channel 16 to the second station 14.

The receiver 200 at the second station 14 demodulates and decodes the signals received at each antenna 210. Receiver 200 includes a controller 220 to control operation of the receiver 200 and a receive signal processor 230. The receive signal processor 230 demodulates and decodes the signal transmitted from the first station 12. The output signal from the receiver 200 comprises an estimate of the original information signal. In the absence of errors, the estimate will be the same as the original information signal input at the transmitter 12.

Figure 2:
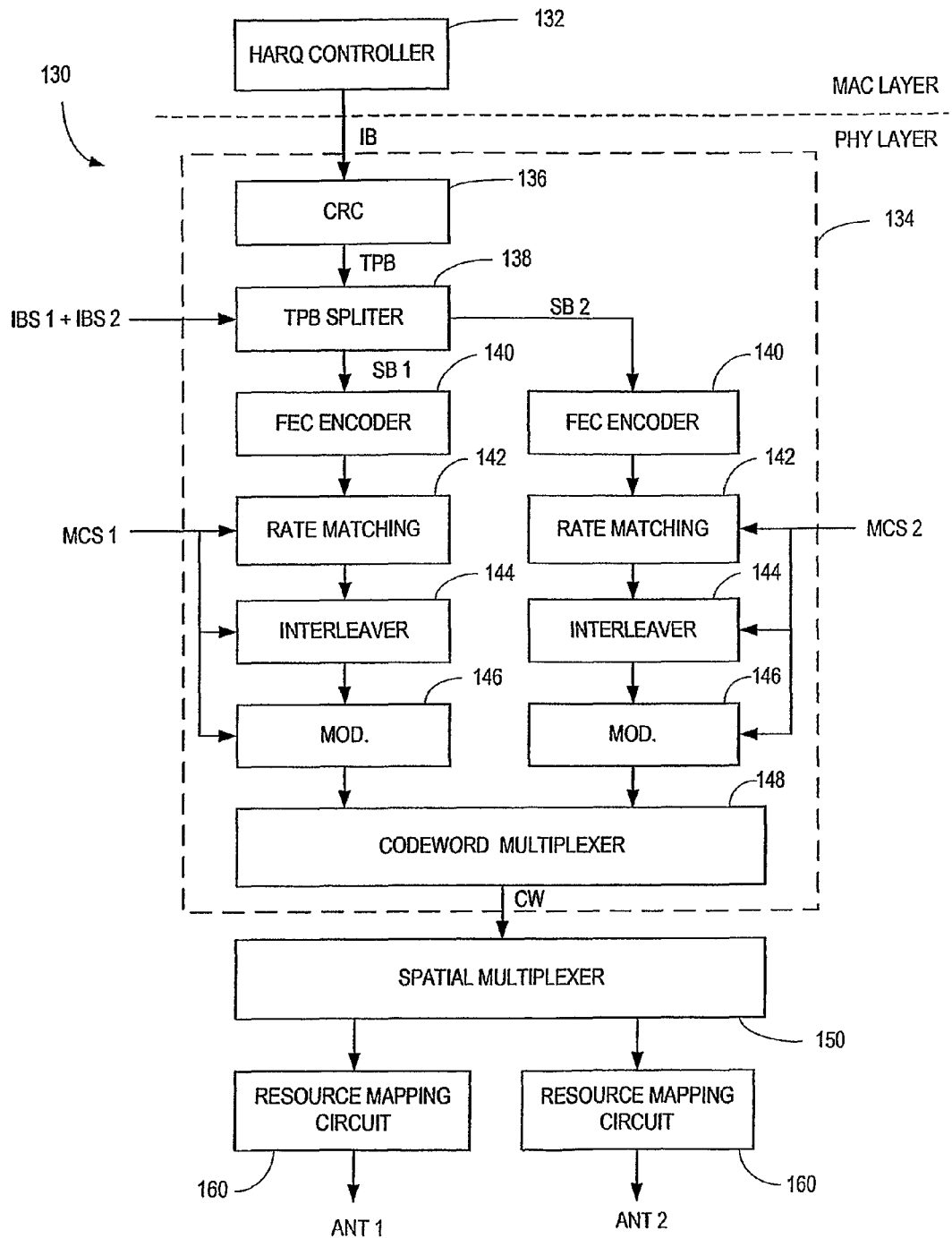
FIG. 2 illustrates an exemplary transmit signal processor for a MIMO communication system.

FIG. 2 illustrates an exemplary transmit signal processor 130 according to one embodiment of the invention. The transmit signal processor 130 comprises an HARQ controller 132 for instantiating a HARQ processes for each transport block, a channel coding circuit 134 for channel coding an information block to be transmitted and generating modulation symbols for transmission, a spatial multiplexer 150 for spatially multiplexing the modulation symbols to generate transmit symbols, and a resource mapping circuit for mapping the transmit symbols output by the spatial multiplexer to the transmit antennas 110.

The HARQ controller 132 implements the HARQ process and provides an information block (IB) to the transmit signal processor 130. A CRC encoder 136, or other error detection encoder, encodes the information block provided by the HARQ controller 132 to generate a transport block (TPB). The HARQ process is implemented in the medium access control (MAC) layer for each TPB. Splitter 138 divides the transport block into two or more parts referred to herein a sub-blocks (SBs). In the exemplary embodiment shown in FIG. 2, it is assumed that the splitter 138 divides the transport block into two sub-blocks (e.g., SB1 and SB2), which may be different sizes. The size of each sub-block is determined by the transmit controller 120 based on the modulation and coding scheme chosen for each sub-block as hereinafter described.

The transit signal processor 130 independently encodes and modulates each sub-block. More particularly, a FEC encoder 140 encodes the sub-blocks using a known forward error correction (FEC) code. For example, the FEC encoder 140 may comprise a turbo encoder, a convolutional encoder, or a block encoder. A rate matching circuit 142 punctures or repeats coded bits output from the FEC encoder 140 to match the number of coded bits to a selected data transmission rate for each sub-block. An interleaver 144 rearranges the order of the coded bits to improve robustness against burst errors that may occur during transmission. Modulator 146 maps the coded and interleaved bits to corresponding modulation symbols. The modulator 146 may, for example comprise a QPSK or QAM modulator. Codeword multiplexer 148 arranges the modulation symbols corresponding to each sub-block to form one or more codewords for transmission to the receiving station 14.

Figure 3:
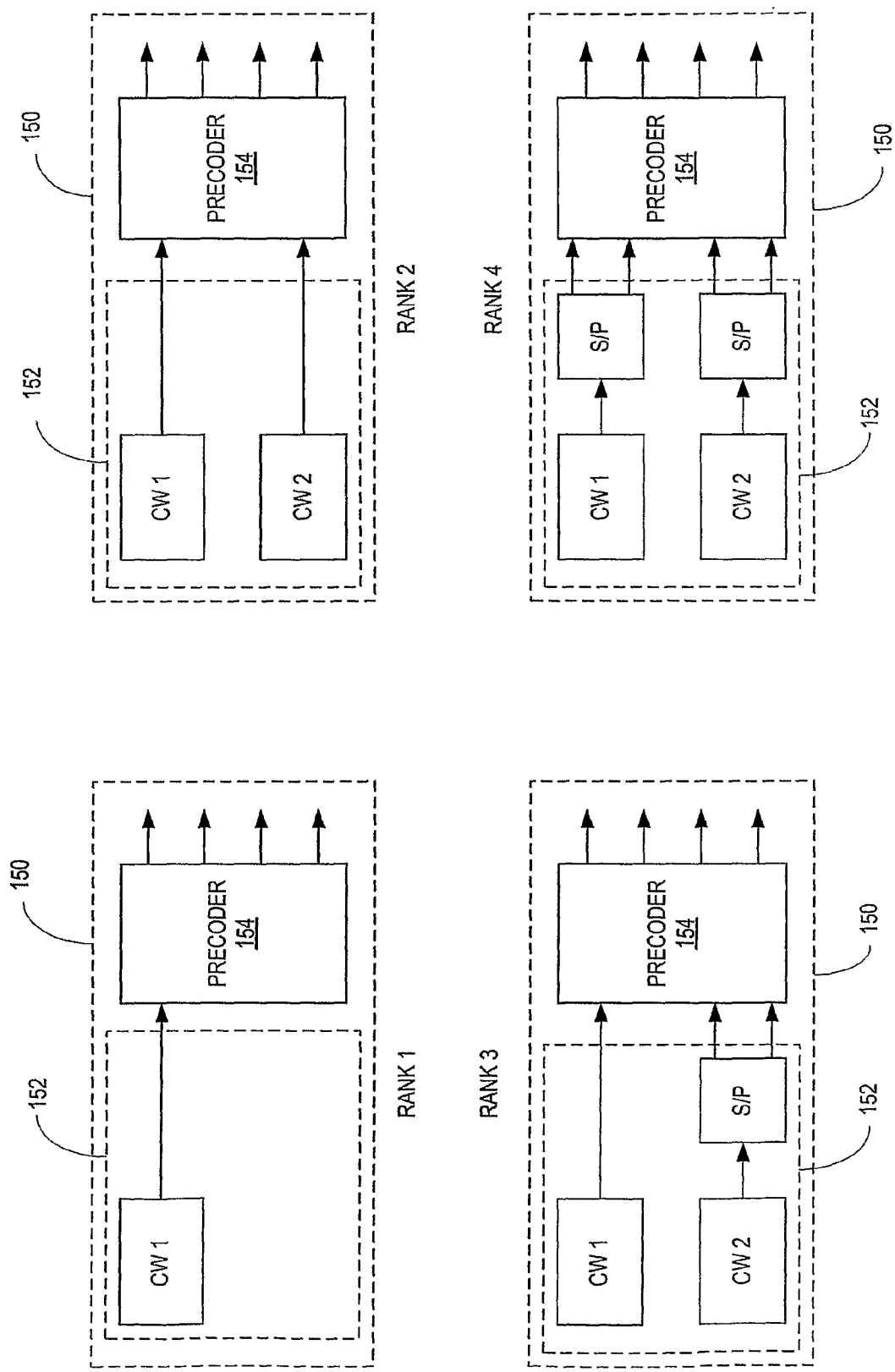
FIG. 3 illustrates an exemplary spatial multiplexer for mapping codewords to layers and precoding the layers for transmission from two or more antennas.
Figure 4:
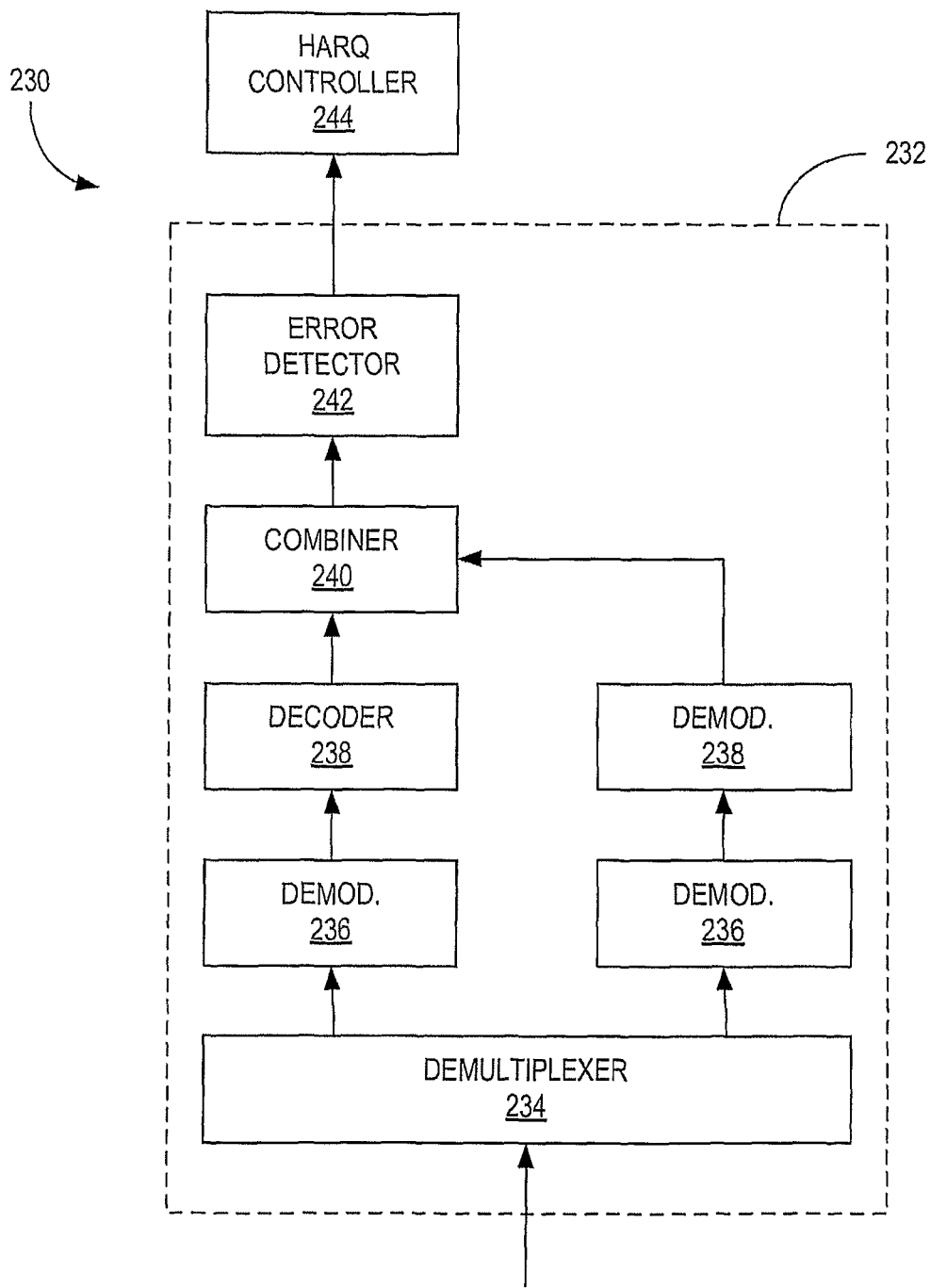
FIG. 4 illustrates an exemplary receive signal processor for a MIMO communication system.

The spatial multiplexer 150, shown in FIG. 3, comprises a layer mapping circuit 152 and precoder 154. The layer mapping circuit 152 maps the symbols for each codeword to one or more layers or streams depending on the transmission rank. FIG. 3 illustrates the configuration of the layer mapping circuit 152 for transmission ranks 1-4. The precoder 154 then precodes the symbols in each layer to generate transmit symbols. In one exemplary embodiment, the layer mapping circuit 152 maps the symbols corresponding to each sub-block to a different layer or group of layers. The layers may be mixed by the precoder 154 through use of precoder cycling or Long Delay Cyclic Delay Decoding (LDCDD) before being output to the antennas 110.

The resource mapping circuits 152 map the transmit symbols output by the spatial multiplexer to corresponding transmit antennas 110. In some embodiments, the resource mapping circuit 152 may map transmit symbols to both physical antennas 110 and virtual antennas. For example, channel dependent precoding may be used to map transit symbols on the virtual antennas to real physical antennas 110 in a way that focuses the energy in the direction of a desired receiving station 14.

Because two or more modulation and coding schemes can be used for each TPB, individual data rate assignments are possible for the layers by mapping different sub-blocks to different layers or groups of layers. The modulation and coding scheme for each sub-block, as well as the size of the sub-block, is selected by the transmit controller 120 based on the effective SINR for each layer. Signaling overhead is not significantly increased because all layers associated with a single TPB are controlled by the same HARQ process. However, because an individual MCS is assigned to each sub-block, an additional control field is introduced in the uplink and/or downlink grants to signal the MCS for each layer. In one exemplary embodiment, the uplink or downlink grant may signal a base MCS for the first layer and an incremental MCS adjustment to be applied to each additional layer.

Figure 5:
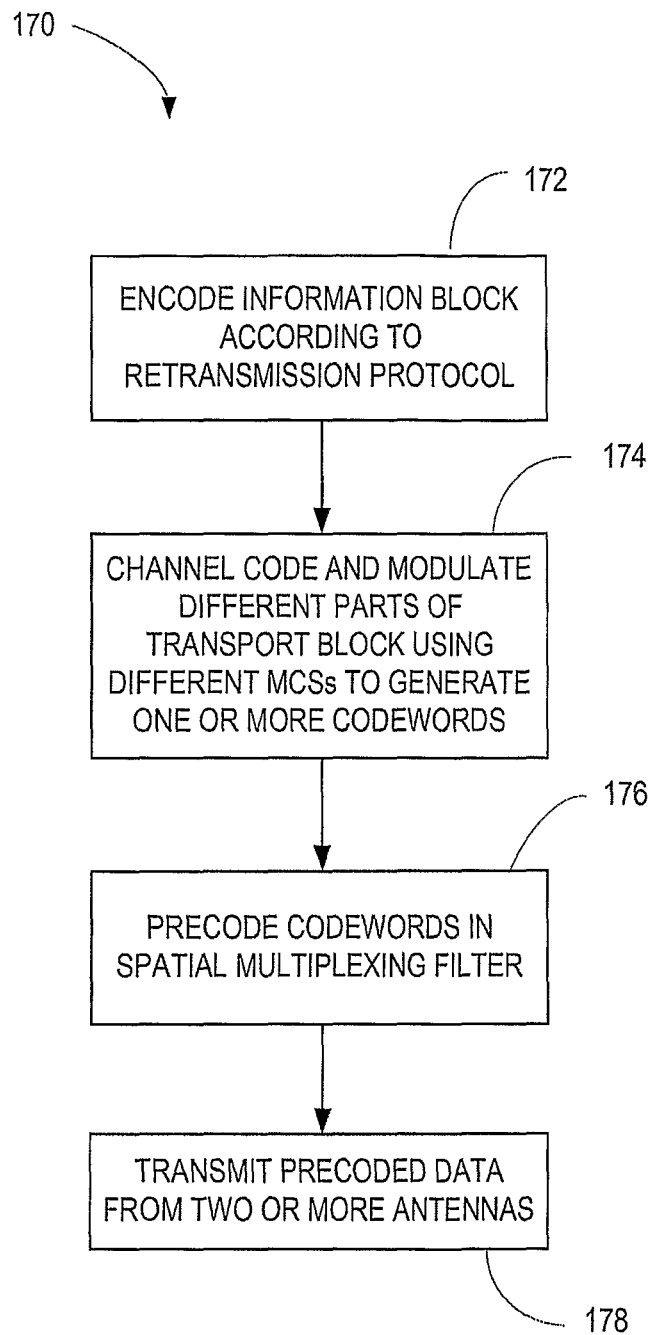
FIG. 5 illustrates an exemplary method for transmitting data in a MIMO communication system.

The receive signal processor 230 at the receiving station 14 demodulates and decodes the sub-blocks, which have been transmitted over different spatial multiplexing layers. A simplified functional block diagram of the receive signal processor 230 at the receiving station is shown in FIG. 5. The receive signal processor 230 includes a channel decoding circuit 232 for independently demodulating and decoding each transport sub-block, and an HARQ controller 244. The channel decoding circuit 232 performs processing tasks that complement the signal processing tasks of the channel coding circuit 134 at the transmitting station 12. A demultiplexer 234 separates the sub-blocks for decoding. A demodulator 236 demodulates each sub-block and a FEC decoder 238 corrects errors that may have occurred during transmission. A combiner 240 reassembles the transport block from the sub-blocks and error detector 242 checks for residual errors in the transport block using error detection bits (e.g., CRC bits) after decoding by the FEC decoder 238. The HARQ controller 242 handles HARQ processing and sends a NACK to the transmitting station 12 if the transport block contains errors after decoding.

FIG. 5 illustrates an exemplary transmission procedure 170 implemented by a transmitter 100 at a transmitting station 12. The procedure begins with the encoding of an information block according to a predetermined retransmission protocol (e.g., HARQ) to generate a transport block having information bits and error detection bits (block 172). Next, the transport block is divided into two or more parts and different parts of the transport block are channel coded using different modulation and coding schemes to generate one or more codewords (block 174). In one exemplary embodiment, the encoded sub-blocks are mapped to different layers and encoded by a spatial multiplexer to generate transmit symbols (block 176). The transmit symbols corresponding to each sub-block may then be transmitted from two or more antennas 110 (block 178).

Figure 6:
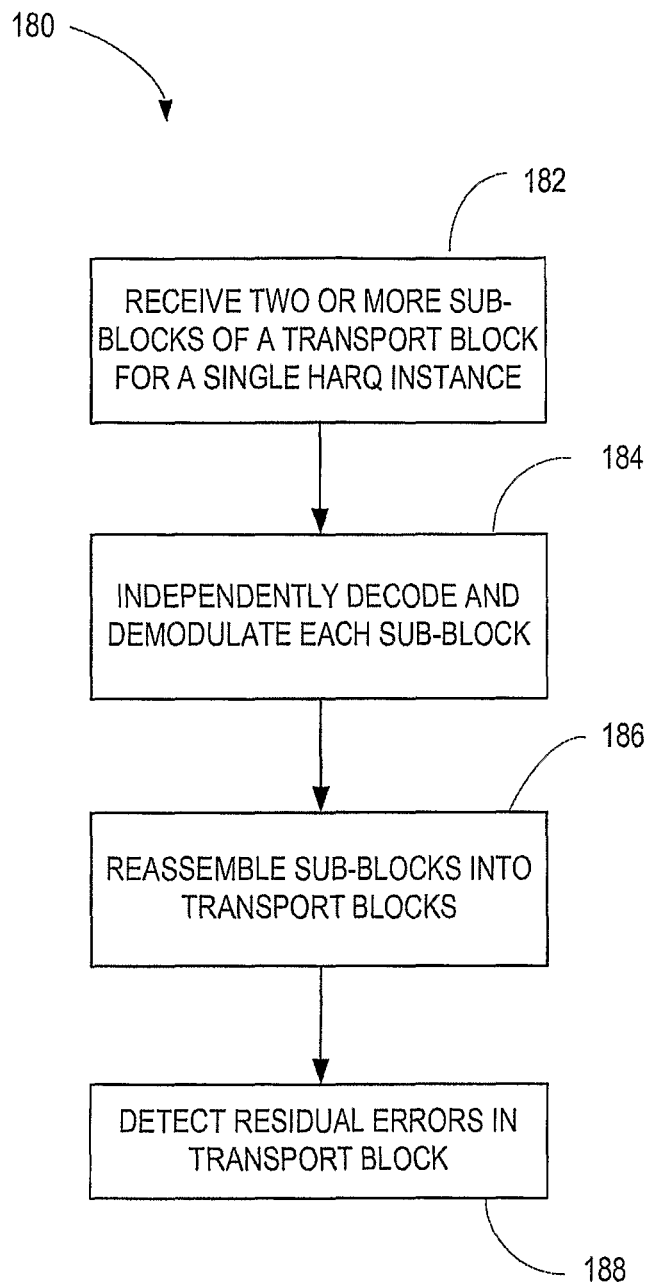
FIG. 6 illustrates an exemplary method for receiving data in a MIMO communication system

FIG. 6 illustrates an exemplary procedure 180 for receiving multi-part transport blocks. The receiving station 14 receives two or more sub-blocks of a transport block for a signal HARQ instance that have been independently coded and modulated (block 182). The receiving station 14 independently demodulates and decodes the transport sub-blocks (block 184), reassembles the sub-blocks into transport blocks, and then performs a CRC check for the reconstructed transport block (block 186). If residual errors are detected, the receiving station sends a NACK to the transmitting station 12 (block 188). The receiving station 14 could, alternatively or additionally, send an ACK if the transport block is received correctly.

Even though the invention so far has been described in the context of spatial multiplexing MIMO system and layer mixing, the same concept is also useful in other settings. As a general principle, the invention may be used in circumstances when different codewords produce mutual interference and the quality of the different codewords is averaged by some property of the transmission link. As one example, the present invention may be used in a SIMO system where a sequence of codewords is transmitted over a time dispersive channel. The time dispersive property of the channel produces mutual interference among the codewords, which can be efficiently removed by a SIC receiver. In this case, efficient MCS selection and signaling is enabled by the use of the invention.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of data transmission comprising:
   encoding an information block according to a predetermined retransmission protocol to generate, for a single hybrid automatic repeat request (HARQ instance, a transport block having information bits and error detection bits;
   channel coding different parts of said transport block using different modulation and coding schemes to generate one or more codewords for transmission to a receiving station;
   wherein channel coding different arts of said transport block using different modulation and coding schemes to generate one or more codewords for transmission to a receiving station comprises:
   dividing the transport block into two or more parts at a transport block splitter,
   independently coding and modulating each part of the transport block to generate partial codewords, and
   multiplexing the partial codewords to generate one or more codewords in a code word multiplexer; and
   spatially multiplexing the one or more codewords in a spatial multiplexer.

2. The method of claim 1 further comprising mapping the codeword(s) to one or more layers and precoding the layers(s) to spatially multiplex the codeword(s) for transmission using two or more antennas.

3. The method of claim 1 wherein encoding an information block according to a predetermined retransmission protocol to generate a transport block having information bits and error detection bits comprises encoding an information block according to a hybrid automatic repeat request (HARQ) protocol.

4. The method of claim 1 wherein independently coding and modulating each part of the transport block to generate partial codewords comprises:
   determining a modulation and coding scheme for each part of the transport block; and coding and modulating each part of the transport block according to the corresponding modulation and coding scheme.

5. The method of claim 4 wherein dividing the transport block into two or more parts comprises dividing the transport block into two or more parts of different sizes selected to match the corresponding modulation and coding for each part.

6. The method of claim 5 further comprising sending control information to the receiving station indicating the selected modulation and coding for each part of the transport block.

7. The method of claim 1 wherein multiplexing the partial codewords to generate one or more codewords comprises serially concatenating the partial codewords to from a single codeword.

8. The method of claim 1 wherein multiplexing the partial codewords to generate one or more codewords comprises combining partial codewords into a two or more codewords.

9. A transmitter comprising:
  an error detection encoder to encode an information block according to a predetermined retransmission protocol to generate a transport block having information bits and error detection bits; and
  a channel encoder to channel code different parts of said transport block using different modulation and coding schemes to generate one or more codewords for transmission to a receiving station;
  a transport block splitter configured to divide the transport block into two or more parts;
  the channel encoder configured to independently code and modulate each part of the transport block to generate partial codewords;
  a codeword multiplexer multiplex the partial codewords to generate one or more codewords; and
  a spatial multiplexer configured to spatially multiplex the one or more codewords.

10. The transmitter according to claim 9 further comprising a spatial multiplexer including a layer mapper for mapping codewords symbols to one or more layers and a precoder to precode the layers to spatially multiplex the codeword(s) for transmission using two or more antennas.

11. The transmitter of claim 9 wherein the error detection encoder is configured to encode an information block according to a hybrid automatic repeat request (HARQ) protocol.

12. The transmitter of claim 9 further comprising a transmit controller to determine a modulation and coding scheme for each part of the transport block; and wherein the channel encoder is responsive to the transmit controller to code and modulate each part of the transport block according to the corresponding modulation and coding scheme.

13. The transmitter of claim 12 wherein the transmit controller is configured to select a size for each part of the transport block to match the corresponding modulation and coding for each part.

14. The transmitter of claim 13 further wherein the transmit controller is further configured to send control information to the receiving station indicating the selected modulation and coding for each part of the transport block.

15. The transmitter of claim 9 wherein the channel encoder is configured to serially concatentate the partial codewords to fbrm a single codeword.

16. The transmitter of claim 9 wherein the channel encoder is configured to multiplex partial codewords into two or more codewords.

* * * * *

UNITED STATES PATENT AND TRADEMARK OFFICE
CERTIFICATE OF CORRECTION

PATENT NO.        : 8,726,131 B2
APPLICATION NO.   : 13/063958
DATED             : May 13, 2014
INVENTOR(S)       : Jöngren et al.

It is certified that error appears in the above-identified patent and that said Letters Patent is hereby corrected as shown below:

Specification

In Column 2, Line 13, delete "layers" and insert -- layers. --, therefor.

In Column 2, Line 25, delete "decoder" and insert -- decoder. --, therefor.

In Column 2, Line 64, delete "receive" and insert -- received --, therefor.

In Column 3, Line 37, delete "system" and insert -- system. --, therefor.

In Column 6, Line 17, delete "SIMO" and insert -- MIMO --, therefor.

Claims

In Column 6, Line 34, in Claim 1, delete "(HARQ" and insert -- (HARQ) --, therefor.

In Column 6, Line 41, in Claim 1, delete "arts" and insert -- parts --, therefor.

In Column 6, Line 54, in Claim 2, delete "layers(s)" and insert -- layer(s) --, therefor.

In Column 7, Line 15, in Claim 7, delete "from" and insert -- form --, therefor.

In Column 8, Line 23, in Claim 14, delete "further wherein" and insert -- wherein --, therefor.

In Column 8, Line 28, in Claim 15, delete "concatentate" and insert -- concatenate --, therefor.

In Column 8, Line 29, in Claim 15, delete "fbrm" and insert -- form --, therefor.

Signed and Sealed this
Sixteenth Day of February, 2016

Michelle K. Lee
*Director of the United States Patent and Trademark Office*